United States Patent [19]
Sato

[11] Patent Number: 5,995,414
[45] Date of Patent: Nov. 30, 1999

[54] NON-VOLATILE SEMICONDUCTOR MEMORY DEVICE

[75] Inventor: Shinichi Sato, Fukuyama, Japan

[73] Assignee: Sharp Kabushiki Kaisha, Osaka, Japan

[21] Appl. No.: 09/126,810

[22] Filed: Jul. 31, 1998

[30] Foreign Application Priority Data

Aug. 28, 1997 [JP] Japan .................................. 9-232689

[51] Int. Cl.$^6$ .................................................. G11C 16/04
[52] U.S. Cl. .................................. 365/185.11; 365/185.18
[58] Field of Search ......................... 365/185.11, 185.13, 365/185.18, 185.23

[56] References Cited

U.S. PATENT DOCUMENTS

| | | | |
|---|---|---|---|
| 5,828,621 | 10/1998 | Tanzawa et al. | 365/185.11 |
| 5,847,994 | 12/1998 | Motoshima et al. | 365/185.11 |

FOREIGN PATENT DOCUMENTS 08195090  7/1996  Japan .

OTHER PUBLICATIONS

H. Onoda, et al., IEEE (1992), "A Novel Cell Structure Suitable for a 3 Volt Operation, Sector Erase Flash Memory", pp. 599–602.

Primary Examiner—Trong Phan
Attorney, Agent, or Firm—Nixon & Vanderhye, P.C.

[57] ABSTRACT

A non-volatile semiconductor memory device comprises a plurality of rewritable non-volatile memory cells arranged in an array and divided into a plurality of blocks, the non-volatile memory cells of each block being connected to a bit-line block by block through a bit-line voltage converter which includes a voltage conversion circuit section and a bypass circuit section, wherein when a selection voltage for writing is applied to the bit line extending through a plurality of blocks, the selection voltage is applied as a first voltage to the bit-line within a block which has been selected for writing so as to write data into the non-volatile memory cells connected to the bit-line within the block, and is applied as a second voltage having a smaller absolute value than the first voltage to the bit-line within a block which has not been selected for writing, by means of the voltage conversion circuit section, and when a voltage for reading is applied to the bit-line extending through the plurality of blocks, the voltage is directly applied to the bit line through the bypass circuit section without using the voltage conversion circuit section. According to the present invention, it is possible to prevent drain disturb effectively and to communicate to the plurality of blocks connected to the bit-line by means of the first or second voltage that the selection voltage has been applied to the bit-line for writing.

5 Claims, 5 Drawing Sheets

NON-VOLATILE SEMICONDUCTOR MEMORY DEVICE

CROSS-REFERENCES TO RELATED APPLICATIONS

This application is related to Japanese Patent Application No. HEI 09-232689 filed on Aug. 28, 1997 whose priority is claimed under 35 USC§119, the disclosure of which is incorporated herein by reference in its entirety.

BACKGROUND OF THE INVENTION

1. Field of the Invention

The present invention relates to a non-volatile semiconductor memory device, and more particularly it relates to a non-volatile semiconductor memory device which is rewritable block by block.

2. Description of the Related Arts

Hitherto, a variety of memories have been proposed as flash memories capable of rewriting data block by block. As an example thereof, operation of an NOR-type memory having a floating gate using an FN writing/FN erasing cell will be described hereinafter with reference to FIG. 3.

In a writing operation, a source is let open and a voltage of 0V is applied to a substrate (P-well), −9V to a control gate and 5V to a drain to extract electrons from the floating gate into the drain, thereby to decrease a threshold voltage Vth of the memory cell.

In an erasing operation, the drain is let open and a voltage of −8V is applied to the source and the substrate (P-well) and 10V to the control gate to inject electrons from the channel into the floating gate, thereby to increase the threshold voltage Vth of the memory cell.

In a reading operation, a voltage of 1V is applied to the drain, 0V to the source and the substrate (P-well) and 3V to the control gate to determine whether or not a current flows in the memory cell, thereby to detect whether or not the writing has been performed (i.e. whether the written data is "0" or "1") in the memory cell.

Referring to FIG. 3, a plurality of memory cells which operate as mentioned above are arranged in a row direction and in a column direction to form a memory array in which the control gate is connected to a word-line and the drain is connected to a bit-line.

In a flash memory, generally, the whole memory array is erased collectively. However, because the whole tip is too large as a unit for erasure, one tip is divided into a plurality of blocks so as to allow erasure of the data block by block.

In such memories, writing operation is generally performed simultaneously on cells connected to one word-line within a block and this writing operation is performed for every word-line.

Accordingly, each block in the memory is independently subjected to the erasing/writing operation, so that rewriting of $10^4$ to $10^5$ times must be ensured in each block in order to ensure rewriting of $10^4$ to $10^5$ times in the whole tip.

In the case where the erasing/writing operation is independently performed in each block, it is necessary to consider the effect (disturbance) which the erasing/writing operation of one block gives to the data in another block. In the above-mentioned cell operation, the following two modes appear as disturbances to be considered in writing.

The first mode is a mode called "drain disturb". In writing, a voltage of 5V is applied to a selected bit-line (drain), so that cells on the same bit-line are stressed by this voltage even if the cells are not subjected to the writing operation. This stress causes electrons to escape from the floating gate into the drain and thus, Vth of such cells drops slightly as compared with the cell which is subjected to the writing operation. The stress described above is very small compared with a stress caused by the writing operation. However, the effect generated by the stress cannot be ignored if the cells continue to receive the stress for a long time. In the above example, when Vth of the cell having a data of high Vth drops lower than a prescribed voltage of 3V, the cell will be a fail bit.

The writing operation is performed as many times as the number of the word-lines. Therefore, in the writing operation for one block, the cells are disturbed for a period of time of (the period of time for writing data into one cell)×(the number of word-lines in the block). Further, if one bit-line is shared by a plurality of blocks, cells of a block which has not been selected for writing receive this disturbance as well. For example, assuming that the number of rewriting times is $10^5$, the number of word-lines in one block is $10^3$ and the bit-line is shared by four blocks, then the possible period of time of drain disturbance for one block is $10^3 \times 4 \times 10^5$ times as long as the period of time for writing one cell.

The second mode is a mode called "gate disturb". At the time of writing, a voltage of −9V is applied to a selected word-line (control gate), so that the cells on the same word-line are stressed by this voltage even if the cells are not subjected to the writing operation. This stress causes electrons to escape from the floating gate into the substrate (P-well) and thus, Vth of such cells drops slightly as compared with the cell which is subjected to the writing operation. In the above example, when Vth of the cell having a data of high Vth drops lower than a prescribed voltage of 3V, the cell will be a fail bit.

If one word-line is shared by a plurality of blocks, cells of a block which has not been selected for writing receive this gate disturbance as well. For example, assuming that the number of rewriting times for one block is $10^5$ and a word-line is shared by four blocks, then the possible period of time of gate disturbance for one block is $4 \times 10^5$ times as long as the period of time for writing data into cells on the word-line of one block.

As a countermeasure against such disturbance, a conventional memory cell has been provided with a decoding circuit for each block so as to make a bit-line and a word-line of each block independent, as shown in FIG. 4. Alternatively, a main bit-line/sub bit-line structure and a main word-line/sub word-line structure have been adopted using a local decoder (or a selection transistor), as shown in FIG. 5, so that a high voltage of writing/erasing will not be applied to the sub bit-line or the sub word-line of a non-selected block even if the high voltage of writing/erasing is applied to the main bit-line or the main word-line.

However, if the above-mentioned structure shown in FIG. 4 is adopted, there arises a problem that an area of a tip increases because every block is provided with a decoding circuit. On the other hand, if a main bit-line/sub bit-line structure and a main word-line/sub word-line structure shown in FIG. 5 are adopted, it is necessary to wire a memory cell with two lines, i.e. a main line and a sub line, so that there arises a problem that the number of wiring layers and thus the number of production steps increase, leading to increased production costs and low yield.

On the other hand, Japanese Unexamined Patent Publication No. HEI 8(1996)-195090 proposes a non-volatile semiconductor memory device provided with a voltage converter for each block so as to apply a first voltage, which is required for writing, to a word-line of a block selected among a plurality of blocks for writing and to apply a second voltage, which has a smaller absolute value than the first voltage, to a word line of the other blocks in performing the writing operation. This provides a method in which the writing operation is performed using the first voltage and the selection of the word line is communicated (transmitted) to other blocks using the first or second voltage.

However, although the gate disturb can be avoided by this method, it is not possible to avoid the drain disturb. Moreover, even if an attempt is made to apply a method similar to this as a countermeasure against the drain disturb, there arises a problem that it is not possible to connect each cell directly to a sensing amplifier in a reading operation because each cell is connected to the bit-line decoder through a voltage conversion circuit, so that this method cannot be directly applied for avoiding the drain disturb. Further, since this method presupposes a writing operation using hot electrons, there arises a problem that a large electric current driving capability is required in the voltage conversion circuit which is provided in each block, thereby increasing the area of the circuit.

SUMMARY OF THE INVENTION

Accordingly, the present invention provides a non-volatile semiconductor memory device comprising a plurality of rewritable non-volatile memory cells arranged in an array and divided into a plurality of blocks, the non-volatile memory cells of each block being connected to a bit-line block by block through a bit-line voltage converter which includes a voltage conversion circuit section and a bypass circuit section, wherein when a selection voltage for writing is applied to the bit line extending through a plurality of blocks, the selection voltage is applied as a first voltage to the bit-line within a block which has been selected for writing so as to write data into the non-volatile memory cells connected to the bit-line within the block, and is applied as a second voltage having a smaller absolute value than the first voltage to the bit-line within a block which has not been selected for writing, by means of the voltage conversion circuit section, and when a voltage for reading is applied to the bit-line extending through the plurality of blocks, the voltage is directly applied to the bit line through the bypass circuit section without using the voltage conversion circuit section.

BRIEF DESCRIPTION OF THE DRAWINGS

The present invention will be better understood from the following detailed description of preferred embodiments of the invention, taken in conjunction with the accompanying drawings, in which.

DETAILED DESCRIPTION OF THE PREFERRED EMBODIMENTS

Figure 1:
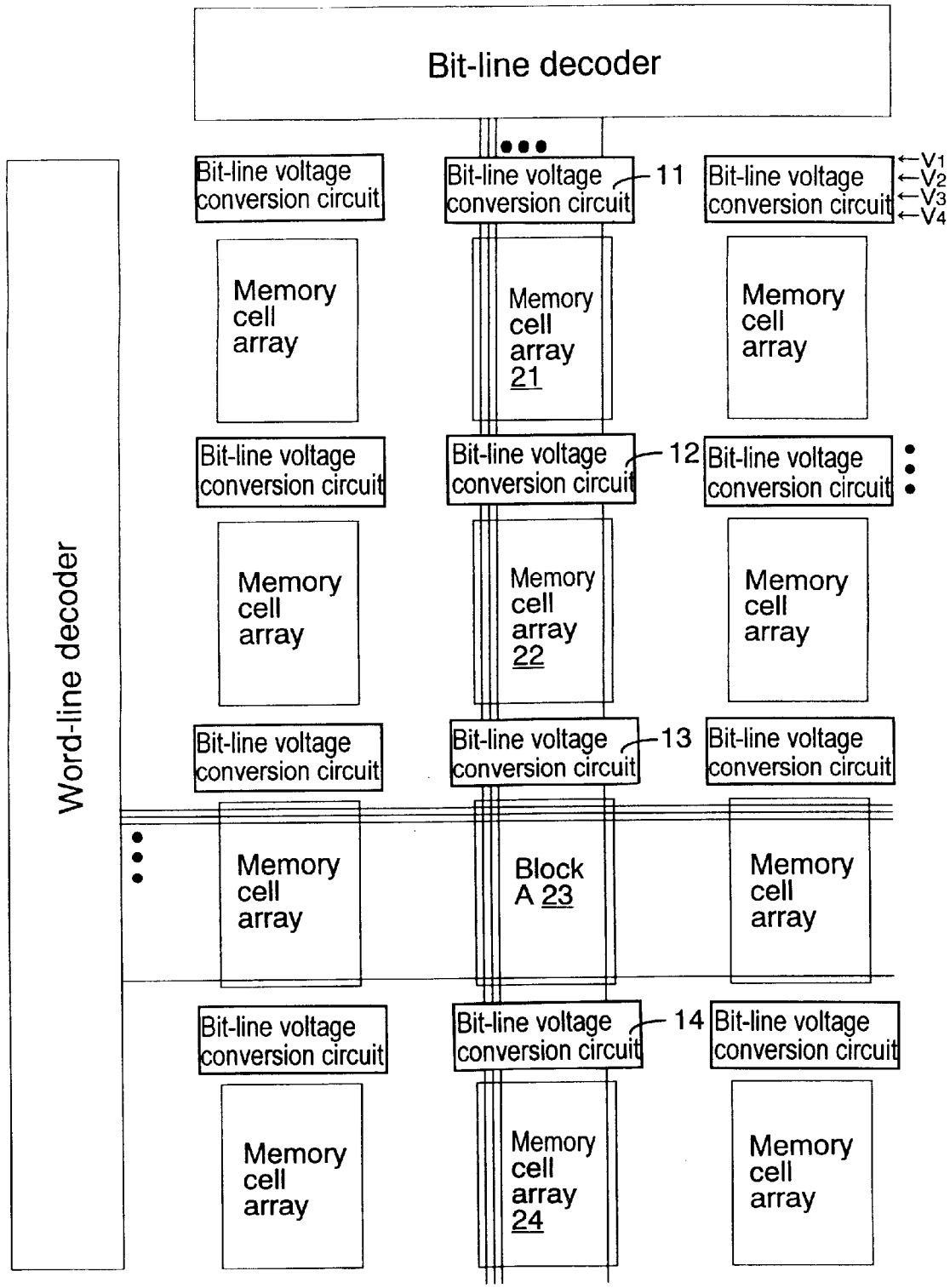
FIG. 1 is a schematic block diagram of an essential part of a non-volatile semiconductor memory device according to the present invention.

The non-volatile semiconductor memory device according to the present invention includes a plurality of non-volatile memory cells arranged in an array. These non-volatile memory cells is divided into a plurality of blocks in a column direction. Preferably, the non-volatile semiconductor memory device includes a plurality of non-volatile memory cells arranged in a matrix and these non-volatile memory cells is divided into a plurality of blocks in a column direction and in a row direction.

The non-volatile memory cells constituting each block may have a known cell structure including, for example, a non-volatile transistor having a floating gate and a control gate which are successively provided on a substrate between source/drain regions through a gate insulating film and/or a tunnel insulating film. These non-volatile transistors are connected to a bit-line/word-line in a column/row direction.

The non-volatile memory cells are connected with each other through a bit-line voltage converter disposed between blocks which are adjacent in a bit-line direction. The bit-line voltage converter includes a voltage conversion circuit section and a bypass circuit section.

When a selection voltage for writing is applied to a bit line extending through a plurality of blocks, the selection voltage can be applied as a first voltage, in response to a signal for converting a bit line voltage, to the bit-line within a block which has been selected for writing through the voltage conversion circuit section so as to write data into the non-volatile memory cells connected to the bit-line within the block. While the selection voltage can be applied as a second voltage having a smaller absolute value than the first voltage, in the absence of the signal for converting a bit line voltage, to the bit-line within a block which has not been selected for writing through the voltage conversion circuit section. In this way, by separately applying a first/second voltage to one bit-line at a position corresponding to the selected/non-selected block, it is possible to prevent drain disturb effectively and to communicate to the plurality of blocks connected to the bit-line by means of the first or second voltage that the selection voltage has been applied to the bit-line for writing.

The voltage to be applied to the bit-line for writing, namely the first voltage which is a voltage to be applied to the bit-line within a block selected for writing, is not particularly limited and may be, for example, a voltage for writing data into an ordinary non-volatile memory cell, i.e. a voltage capable of extracting electrons from the floating gate by means of an FN current generated between the drain and the floating gate. Specifically, the first voltage is preferably a little higher than a power supply voltage. Such a voltage may be realized by a boosting circuit mentioned specifically in the following embodiments. The voltage to be applied to the bit-line to which the selection voltage for writing has been applied but which is in a block that has not been selected for writing, namely the second voltage, may have a lower absolute value than the first voltage. Specifically, the second voltage may be approximately as high as the above-mentioned power supply voltage.

Further, when a voltage for reading is applied to the bit-line extending through the plurality of blocks, the voltage is directly applied to the bit-line through the bypass circuit section without using the voltage conversion circuit section.

Here, the method of selecting a block to be subjected to the writing operation from among a plurality of blocks is not specifically limited and may be carried out by a known method. The voltage to be used in the selection is not specifically limited and may be a voltage which is approximately as high as the power supply voltage.

Also, the voltage conversion circuit section selectively provides with the first/second voltage in accordance with the presence/absence of the signal for converting the bit line voltage. This signal is transmitted to the voltage conversion circuit portion by means of a method similar to the above-mentioned method for selecting a block to be subjected to the writing operation.

In the present invention, each block may be connected to a plurality of word-lines through a word-line voltage converter having a voltage conversion circuit. In this case, the word-line voltage converter may be an element disclosed in, for example, Japanese Unexamined Patent Publication No. HEI 08(1996)-195090. However, the word-line voltage converter need not include a bypass circuit which is required in the bit-line voltage converter.

An embodiment of a non-volatile semiconductor memory device according to the present invention is hereafter detailed with reference to the attached drawings.

Referring to FIG. 1, the non-volatile semiconductor memory device includes a memory cell array which is divided into 16 blocks. A word-line decoder and a bit-line decoder are disposed outside of the memory cell array of 16 blocks. The word-line and the bit-line are each formed of a single wiring layer and are connected to each block through a word-line voltage conversion circuit and a bit-line voltage conversion circuit, respectively.

Each memory cell array is constructed, for example, in such a manner that 512 k memory cells are connected to 512 bit-lines and 1024 word-lines. Basically, the non-volatile semiconductor memory device having such a construction can be subjected to a writing/erasing and reading operation in the same manner as in a conventional non-volatile semiconductor memory device. Namely:

In the writing operation, the source is let open, a voltage of 0V is applied to the substrate (P-well), −9V to the control gate, and 5V to the drain to extract electrons from the floating gate into the drain, thereby to reduce a threshold voltage Vth of the memory cell.

In the erasing operation, the drain is let open, a voltage of −8V is applied to the source and the substrate (P-well), and 10V to the control gate to inject electrons from the channel into the floating gate, thereby to raise the threshold voltage Vth of the memory cell.

In the reading operation, a voltage of 1V is applied to the drain, 0V to the source and the substrate (P-well), and 3V to the control gate to determine whether a current flows in the memory cell or not, thereby to read whether or not the writing has been performed (i.e. whether the written data is "0" or "1") in the memory cell.

Hereafter, an explanation will be given on a method of preventing drain disturb when the block A is in operation in the non-volatile semiconductor memory device of the present invention.

In writing, a High/Low (first/second) voltage is applied to each bit-line running through the block A23 by the bit-line decoder in accordance with the data of each bit. Here, it is assumed that the High represents a voltage of 3V and the Low represents a voltage of 0V.

The voltage supplied from the bit-line decoder is inputted into bit-line voltage conversion circuit 11 of a memory cell array 21, i.e. a first block, and is outputted in a voltage of the same magnitude. The voltage is given to the memory cells in the first memory cell array 21 and is also inputted into a bit-line voltage conversion circuit 12 of the memory cell array 22, i.e. a second block. Similarly, a voltage of the same magnitude as the input voltage is given to the memory cells in the second memory cell array 22, and this voltage is inputted into a bit-line voltage conversion circuit 13 of the block A23. The bit-line voltage conversion circuit 13 of the block A23 outputs a voltage of 0V in response to an input of 0V, but outputs a voltage of 5V in response to an input of 3V. This voltage is given to the memory cells in the block A23 and is inputted into the bit-line voltage conversion circuit 14 of the memory cell array 24, i.e. a fourth block. The bit-line voltage conversion circuit 14 of the fourth memory cell array 24 outputs a voltage of 0V in response to an input of 0V, but outputs a voltage of 3V in response to an input of 5V. This voltage is given to the memory cells in the fourth memory cell array 24.

Thus, in the above device, the High voltage applied to the bit-line within the non-selected block is 3V, which is lower by 2V than the High voltage of 5V applied to the bit-line within the selected block for writing. Accordingly, the disturb generated in the non-selected block can be reduced to $\frac{1}{10000}$ or less of the disturb generated in the case where 5V is supplied. Therefore, the effect of writing for $10^5$ times in other blocks will not be a problem any more. Also, since the memory cell array does not involve a main/sub bit-line structure, the wiring structure for the bit-line requires only one layer, so that the number of manufacturing steps will not increase.

Figure 2:
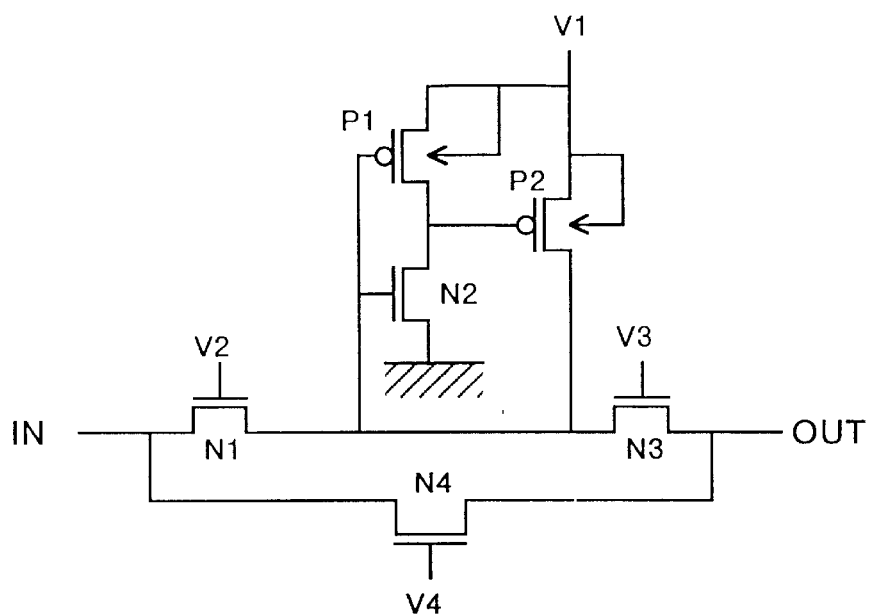
FIG. 2 is a circuit diagram of a bit-line voltage converter in the non-volatile semiconductor memory device according to the present invention.
Figure 3:
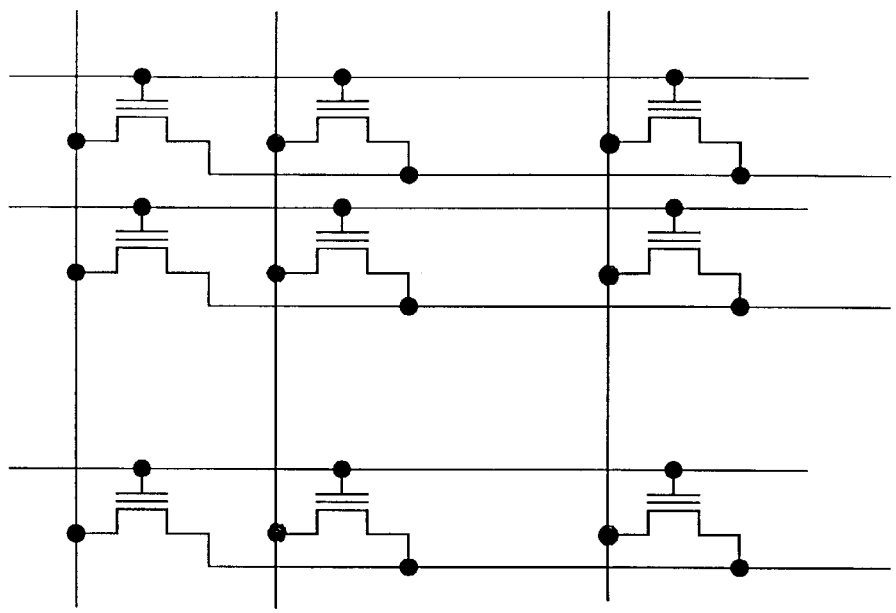
FIG. 3 is a schematic diagram illustrating a memory array of a conventional non-volatile semiconductor memory device.
Figure 4:
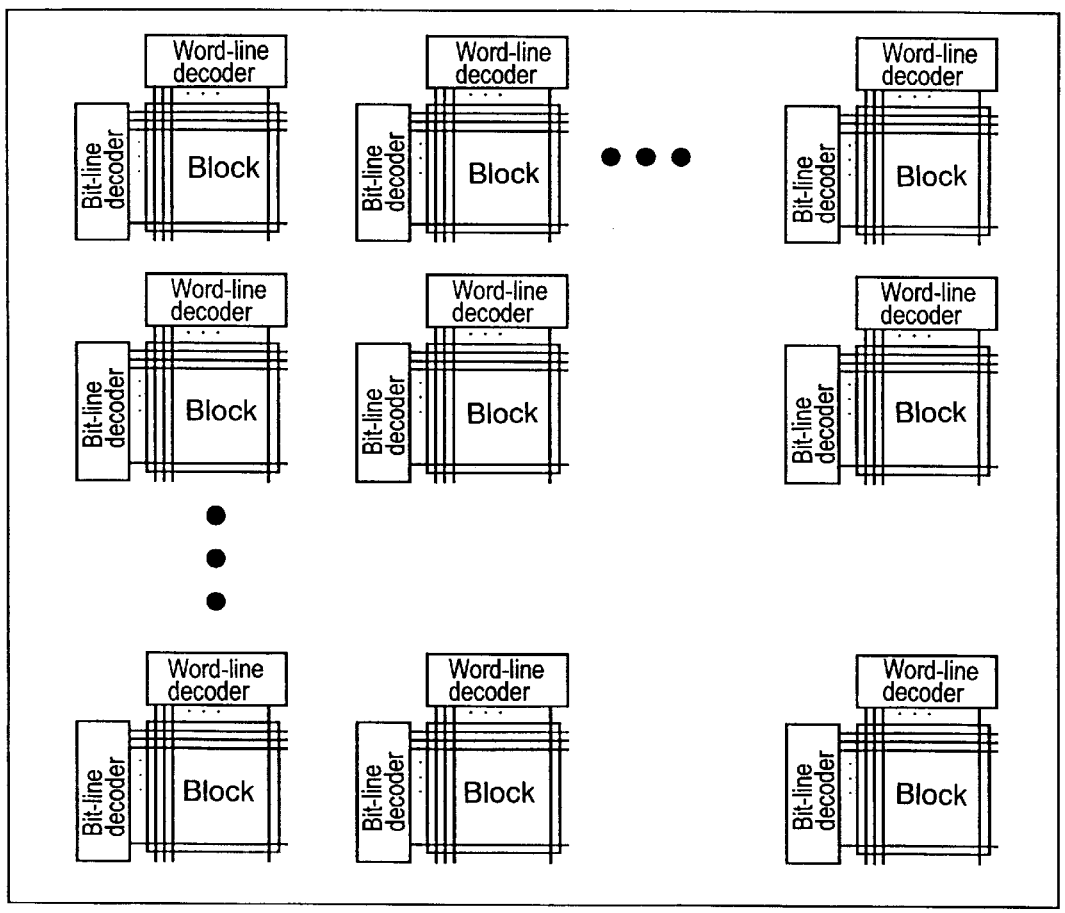
FIG. 4 is a schematic block diagram of an essential part of a conventional non-volatile semiconductor memory device.
Figure 5:
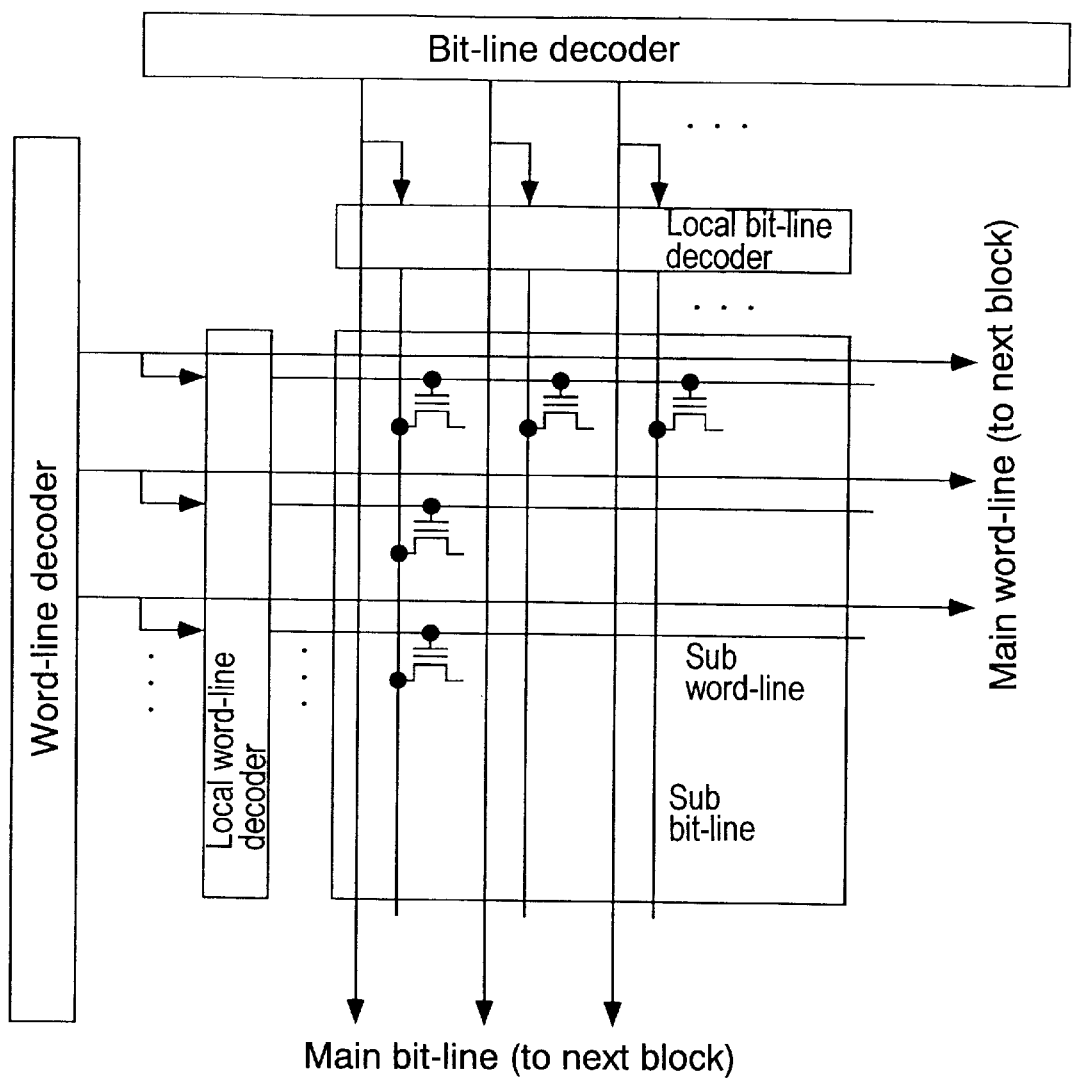
FIG. 5 is a schematic block diagram of an essential part of another conventional non-volatile semiconductor memory device.

Next, an embodiment of a bit-line voltage conversion circuit according to the present invention will be hereafter detailed with reference to FIG. 2.

This circuit includes four NMOS transistors (N1 to N4) and two PMOS transistors (P1, P2). The voltage configuration of V1, V2, V3, and V4 in each operation is shown in the following table.

TABLE 1

| | V1 | | V2 | V3 | V4 |
|---|---|---|---|---|---|
| | selected block | non-selected block | | | |
| Writing | 5V | 3V | 3V | 7V | 0V |
| Reading | | 3V | 0V | 0V | 3V |
| Erasing | | 3V | 0V | 0V | 3V or 0V |

In the writing operation, N4 is turned off and a voltage of High or Low is inputted from the IN side. If this block is selected for writing, the input voltage of High is 3V and the input voltage of Low is 0V.

When a voltage of 0V is inputted from the IN side, the gates of N2 and P1 become 0V, and N2 is turned off and P1 is turned on. Therefore, the gate of P2 becomes V1, i.e. 5V, and P2 is turned off. Accordingly, the voltage of 0V inputted from the IN side passes directly through N1 and N3 and is outputted to the OUT side.

When a voltage of 5V is inputted from the IN side, the gates of N2 and P1 become about 2V, which is lower than the voltage 3V of V2 by an amount Vth of N1, so that both N2 and P1 are turned on. Therefore, the gate of P2 assumes an intermediate value between V1 and 0V, the value being determined by a resistance partition of N2 and P1, so that P2 will be in a light on-state. Through P2, therefore, V1 which is equal to 5V is outputted to the gate of N2 and the source of N3. Here, since a sufficiently high voltage of 7V is applied to the gate of N3, the voltage of 5V is outputted to the OUT side through N3. Also, since the gate of N1 is 3V, a voltage higher than 3V-Vth will not flow back to the IN side.

When a voltage of 3V is inputted from the IN side, the voltage inside N1 is about 2V because it is determined by V2(5V)-Vth. The subsequent results are the same as in the case of 5V input.

If this block is non-selected, the operation will be the same as in the case of the selected block except that V1 is 3V, so that a voltage of 0V is outputted if the input is 0V, and a voltage of 3V is outputted if the input is 3V. Even if the input is 5V, the inside of N1 receives the same voltage as in the case of 3V input because the gate voltage of N1 is 3V, so that the output is 3V.

In the reading operation, the current flowing into the memory cell through the bit-line must be sensed in the outside of the memory cell, so that the bit-line must be directly connected to the sensing amplifier and the transfer of electric current between the bit-line and the bit-line voltage conversion circuit must not take place. Accordingly, in this embodiment, N1 and N3 are turned off and N4 is turned on so as to continuously connect the bit-line, which extends through a plurality of blocks, by means of the bypass circuit.

In the erasing operation, only the transfer of electric current between the bit-line and the outside must be prohibited, so that N1 and N3 are turned off and N4 may be either on or off. However, if N4 is on, the bit-line must be let open by the bit-line decoder.

If a word-line voltage conversion circuit is to be used in the present invention, it can be constructed substantially in the same manner as the bit-line voltage conversion circuit. However, the bypass circuit, which is needed in the bit-line voltage conversion circuit for the reading operation, is not required, and the conversion of voltage is carried out in the negative direction.

According to the present invention, since the bit-line voltage converter includes a voltage conversion circuit section and a bypass section, the gate disturb and the drain disturb can be prevented with a smaller area as compared with a decoder circuit. Also, since the main bit-line/sub bit-line structure is not needed, it is not necessary to increase the number of wiring layers, thereby eliminating the need to increase the number of manufacturing steps. This can prevent the increase of costs and the lowering of yield.

In addition, since the current consumption in writing will be $1/10^5$ per memory cell by using an FN tunnel current in writing into the memory cells, a sufficient amount of electric current can be supplied to a bit-line even if a bit-line voltage converter of a comparatively smaller area is used as described before, thereby ensuring reliability of the device.

Although the present invention has fully been described by way of example with reference to the accompanying drawings, it is to be understood that various changes and modifications will be apparent to those skilled in the art. Therefore, unless otherwise such changes and modifications depart from the scope of the invention, they should be construed as being included therein.

What I claim is:

1. A non-volatile semiconductor memory device comprising a plurality of rewritable non-volatile memory cells arranged in an array and divided into a plurality of blocks, the non-volatile memory cells of each block being connected to a bit-line block by block through a bit-line voltage converter which includes a voltage conversion circuit section and a bypass circuit section, wherein when a selection voltage for writing is applied to the bit line extending through a plurality of blocks, the selection voltage is applied as a first voltage to the bit-line within a block which has been selected for writing so as to write data into the non-volatile memory cells connected to the bit-line within the block, and is applied as a second voltage having a smaller absolute value than the first voltage to the bit-line within a block which has not been selected for writing, by means of the voltage conversion circuit section, and when a voltage for reading is applied to the bit-line extending through the plurality of blocks, the voltage is directly applied to the bit line through the bypass circuit section without using the voltage conversion circuit section.

2. The non-volatile semiconductor memory device of claim 1, wherein each non-volatile memory cell includes a floating gate and a control gate successively laminated on a substrate between source/drain regions and is constructed in such a manner that writing is performed by means of an FN tunnel current generated between the drain and the floating gate.

3. The non-volatile semiconductor memory device of claim 1, wherein the second voltage is a power supply voltage.

4. The non-volatile semiconductor memory device of claim 1, wherein the voltage conversion circuit has a boosting circuit and the first voltage is generated by the boosting circuit.

5. The non-volatile semiconductor memory device of claim 1, wherein a plurality of bit lines are connected to the non-volatile memory cells arranged in a plurality of arrays within each block.

* * * * *